US006307160B1

United States Patent
Mei et al.

(10) Patent No.: US 6,307,160 B1
(45) Date of Patent: Oct. 23, 2001

(54) HIGH-STRENGTH SOLDER INTERCONNECT FOR COPPER/ELECTROLESS NICKEL/IMMERSION GOLD METALLIZATION SOLDER PAD AND METHOD

(75) Inventors: Zequn Mei, Cupertino; Ali Eslambolchi, Los Gatos, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/182,979

(22) Filed: Oct. 29, 1998

(51) Int. Cl.[7] ....................................... H05K 1/03
(52) U.S. Cl. .................. 174/256; 29/830; 228/262.6; 174/260
(58) Field of Search ........................ 174/256, 259, 174/260, 261; 361/767, 768, 771, 783; 257/737, 738, 741, 777, 778, 779; 439/65, 78, 83; 228/262.3, 262.6; 29/830

(56) References Cited

U.S. PATENT DOCUMENTS

| 4,603,805 | | 8/1986 | Rogers .................................. 228/123 |
| 5,166,774 | * | 11/1992 | Banerji et al. ........................ 361/398 |
| 5,591,941 | * | 1/1997 | Acocella et al. ..................... 174/266 |
| 5,699,611 | * | 12/1997 | Kurogi et al. ........................... 29/840 |
| 5,720,100 | * | 2/1998 | Skipor et al. ........................... 29/840 |
| 5,808,874 | * | 9/1998 | Smith ..................................... 361/769 |
| 5,844,315 | * | 12/1998 | Melton et al. ........................ 257/738 |
| 5,910,644 | * | 6/1999 | Goodman et al. .................... 174/260 |
| 6,025,649 | * | 2/2000 | DiGiacomo ........................... 257/779 |
| 6,127,735 | * | 10/2000 | Berger et al. ......................... 257/778 |

OTHER PUBLICATIONS

Patrick J. Callery, "Mechanical Reliability of Mid–Range Ball Grid Array Packages", EAMC'97 Proceedings, pp. 28–35.

Edwin Bradley and Kingshuk Banerji, "Effect of PCB Finish on the Reliability and Wettability of Ball Grid Array Packages", IEEE Transactions on Components . . . —Part B, vol. 19, No. 2, May 1996, pp. 320–330.

(List continued on next page.)

Primary Examiner—Jeffrey Gaffin
Assistant Examiner—Jeremy Norris
(74) Attorney, Agent, or Firm—Marc R. Mayer

(57) ABSTRACT

A high-strength solder interconnect formed on a copper/electroless nickel/immersion gold metallization solder pad and method. The invention provides a low cost, high-strength solder interconnect on a copper/electroless nickel/immersion gold metallization (CENIGM) pad that can be formed at a temperature at or below the temperature used in eutectic tin-lead (Sn—Pb) solder applications. The invention includes a first substrate having a solder-wettable pad and a second substrate having a copper/electroless nickel/immersion gold metallization (CENIGM) solder pad. The invention also provides a solder interconnect between the solder-wettable pad and the CENIGM solder pad. The invention may provide a solder interconnect that includes a solder body including at least 2% indium (In) by weight and wetted to both the CENIGM solder pad and the solder-wettable pad. The invention may alternatively includes both a solder bump wetted to the solder-wettable pad and a solder joint, including at least 2% In by weight, wetted to the solder bump and the CENIGM solder pad. The method includes obtaining a first substrate including a solder-wettable pad and forming a solder bump on the solder-wettable pad. A second substrate is obtained including a CENIGM solder pad. Next, solder paste, including at least 5% In, is applied to the CENIGM solder pad and the solder bump is moved into contact with the solder paste. The solder paste is then reflowed to generate a solder joint wetted to the solder bump and the CENIGM solder pad.

20 Claims, 3 Drawing Sheets

OTHER PUBLICATIONS

Karl J. Puttlitz, "Preparation, Structure, and Fracture Modes of Pb–Sn and Pb–In Terminated Flip–Chips Attached to Gold Capped Microsockets", IEEE Transaction on Components . . . , vol. 13, No. 4, Dec. 1990, pp. 647–655.

V. F. Hribar et al., "Microstructure of Electroless Nickel–Solder Interactions", $3^{rd}$ Intl. SAMPE Electronics Conference, Jun. 20–22, 1989, pp. 1187–1199.

Zequn Mei et al., "Interfacial Failure of BGA Packages on Cu/Ni/Au", EAMC'97 Proceedings, pp. 602–611.

Jing Li Fang et al., "Factors Influencing Solderability of Electroless Ni–P Deposits", Plating & Surface Finishing, Jul. 1992, pp. 44–47.

Kwang–Lung Lin et al., "Wetting Behavior between Solder and Electroless Nickel Deposits", Materials Chemistry and Physics 38, 1994, pp. 33–41.

F. G. Yost, "Soldering to Gold Films", Gold Bulletin, vol. 10, 1977, pp. 94–100.

Zequn Mei et al, "Low Temperature Solders", EXMC'95 Proceedings, pp. 71–84.

B. Wong et al., "Fatique–Resistant Solder", Proc. SMT International, 1993, pp. 484–493.

Kingshuk Banerji et al., "Manufacturability and Reliability of Products Assembled with New PCB Finishes", SMI 1994, pp. 584–595.

Chwan–Ying Lee et al., "Materials Interaction in Pb–Sn/Ni–P/A1 and Pb–Sn/Ni–B/A1 Solder Bumps on Chips", Thin Solid Films, 229, 1993, pp. 63–75.

Chwan–Ying Lee et al., "The Interaction Kinetics and Compound Formation between Electroless I–P and Solder", Thin Solid Films, 249, 1994, pp. 201–206.

Zequn Mei et al., Charcterization of Eutectic Sn–Bi Solder Joints, Journal of Electronic Materials, vol. 21, No. 6, 1992, pp. 599–607.

* cited by examiner

HIGH-STRENGTH SOLDER INTERCONNECT FOR COPPER/ ELECTROLESS NICKEL/IMMERSION GOLD METALLIZATION SOLDER PAD AND METHOD

BACKGROUND OF THE INVENTION

1. Field of the Invention

This invention generally relates to electronic packaging and assembly. More particularly, this invention relates to electronic interconnect technology, specifically to solder interconnects on copper/electroless nickel/immersion gold metallization surfaces.

2. Description of the Related Art

Electrically conductive interconnects have been used for years within the semiconductor industry in all manner of attachment applications. They are used, for example, to make both first level (integrated circuit (IC) to package) connections and second level (electronic component package to substrate) connections. Examples of simple conductive interconnects include: pin-through-hole, wirebonding, tape automated bonding (TAB), leaded surface mount, bump grid array, and flip-chip interconnects.

As semiconductor technology and printed circuit board (PCB) technology have advanced and semiconductor devices have become more complex and powerful, the need for smaller electrically conductive interconnects for use in high density applications has likewise grown. As interconnects have become smaller and more densely packed, it has become necessary to have flatter interconnect attachment surfaces in order to ensure reliability.

The common method for forming solder pads on substrates is hot air solder leveling (HASL). However HASL produced solder pad surfaces that are not flat enough to be used reliably in all high-density applications. Several alternatives to HASL are now being used in the PCB and semiconductor industries, including organically coated copper (OCC) and copper/electroless nickel/immersion gold metallization (CENIGM). OCC creates sufficiently flat solder pads, but is difficult to test by probing and does not hold up well during multiple soldering reflow cycles.

The reliability of Tin-Lead (Sn—Pb) solder joints formed on CENIGM solder pads has been tested by semiconductor and printed circuit assembly (PCA) industries. The testing indicated Sn—Pb solder joints formed on CENIGM solder pads are subject to interfacial brittle fracture failure during mechanical loading. Such mechanical loading might include, for example, bending or vibrating a printed circuit board (PCB) with an IC package such as a bump grid array (BGA) package attached, dropping a PCB on the floor, or prying a BGA off with a screw driver. The solder joints formed on CENIGM solder pads were found to fracture under bending at loads significantly lower than solder joints formed on OCC or HASL pads (Z. Mei, M. Kaufmann, A. Eslambolchi, and P. Johnson, "Brittle interfacial fracture of PBGA packages soldered on electroless nickel immersion gold", 48th ECTC conf. proceeding, 1998, pp. 952–961; E. Bradley and K. Baneji, "Effect of PCB finish on the reliability and wettability of BGA packages", 45th ECTC conf. proceeding, 1995, pp. 1028–1030; and E. Bradley, lecture in Ninth Annual Soldering Symposium, SUNY-Binghamton, Oct. 21, 1996).

The fracture of solder joints on CENIGM occurred by a cleavage within the bonding intermetallic layer between Sn—Pb solder and CENIGM, while the strength of solder joints on OCC and HASL was much stronger and fracture of these solder joints occurred by peeling the solder pads off PCB. The root cause of the brittle interfacial fracture of solder joint on CENIGM is not been known, although the phosphorus in electroless nickel is suspected, since the brittle interfacial fracture does not occur in solder joints on Cu/electrolytic Nickel/Electrolytic Gold surface finish.

Because the phenomenon of brittle interfacial fracture of solder joints on CENIGM is being extensively observed in PCA industry, an extensive effort to find the root cause and solution for the problem of brittle interfacial fracture by PCB fabricators, plating chemistry and equipment suppliers, and original equipment manufacturers (OEMs).

Additionally, poor wetting and adhesion strength of both Pb—Sn and Lead-Indium (Pb—In) solder bumps on the CENIGM in solder bump flip-chip interconnections has been observed (K. Puttlitz, "Preparation, structure, and fracture modes of Pb—Sn and Pb—In terminated flip-chip attached to gold capped microsockets", IEEE Trans-CHMT, vol. 13, 1990, p. 647–655). The poor wetting, is thought due to a precipitate phase, $Ni_3P$ and was also described by V. F. Hribar, J. L. Bauer, and T. P. O'Donnell, "Microstructure of electroless nickel-solder interactions," 3rd International SAMPE Electronics Conf., Jun. 20–22, 1989, pp. 1187–1199.

It is not clear if the brittle interfacial fracture problem and the poor wetting problem have the same root cause. Thus far, no solution to the brittle interfacial fracture problem has been proposed, while several solutions to the problem of weak solder joint formation on CENIGM solder pads due to poor wetting have been proposed. One solution for the poor wetting and adhesion strength of both Pb—Sn and Pb—In solders on CENIGM is coating the electroless Nickel (Ni) with a layer of gold (Au) 3 to 4 times thicker than the standard immersion gold thickness. The Ni and Au are then heated to 600–650° C. to convert the Au layer into a Au—Ni alloy which is not susceptible to molten solder consumption as is pure Au. This solution is not readily adaptable applicable to CENIGM solder pads formed on standard PCB materials since most PCBs cannot survive at the temperatures required to form the Au—Ni alloy.

A second solution to the problem can be found in U.S. Pat. No. 4,603,805 entitled, "Method for enhancing the solderability of nickel layers." The patent describes a method of enhancing the solderability of phosphorus containing Ni by heating the Ni surface to a temperature above 347° C. first in an oxidizing atmosphere and then in a reducing atmosphere prior to soldering. The oxidation treatment converts the phosphorus (P) to phosphorus oxides ($P_2O_3$, $P_2O_3$, or $P_2O_5$). These oxides sublime or boil away from the surface. This solution requires expensive equipment to implement, extensive time for processing, and requires temperatures higher than most PCBs can tolerate.

In addition, saccharin has been reported to be able to greatly enhance the solderability of electroless Ni deposit (J. L. Fang, X. R. Ye and J. Fang, Plat. and Surf. Fin., July 1992, p.44).

Finally, there has been some indication that increased wetting of Sn—Pb solders on electroless Ni can be accomplished by aging the solder joint at 150° C. for 30 minutes, or 250° C. for 30 minutes for more significant improvement (K. L. Ling and J. M. Jang, "Wetting behavior between solder and electroless nickel deposits," Materials Chemistry and Physics, vol. 38, 1994, pp. 33). This solution subjects sensitive electronic components to high temperatures for relevantly long periods of time and extends the component attachment process from one that normally takes seconds to one that takes half an hour.

Accordingly, it is apparent that there is a need for a high-strength solder interconnect on CENIGM that can be formed using current solder interconnect processes, equipment, and temperatures, and which doesn't add significant time or expense to the manufacturing process.

SUMMARY OF THE INVENTION

Generally the invention provides a low cost, high-strength solder interconnect on a copper/electroless nickel/immersion gold metallization (CENIGM) solder pad that can be formed at a temperature at or below the temperature used in eutectic tin-lead (Sn—Pb) solder applications. In addition, the invention provides a method for forming a high-strength solder interconnect on a CENIGM solder pad that doesn't require specialized equipment beyond that already used for forming Sn—Pb solder interconnects. The invention additionally provides a method for forming a high-strength solder interconnect on a CENIGM solder pad that doesn't require significantly more manufacturing time than known Sn—Pb solder interconnect manufacturing techniques.

More specifically, the invention provides a high-strength solder interconnect including a first substrate having a solder-wettable pad and a second substrate having a copper/electroless nickel/immersion gold metallization (CENIGM) solder pad. The invention also provides a solder connection between the solder-wettable pad and the CENIGM solder pad. The invention may provide a solder connection that includes a solder body including at least two percent (2%) indium (In) by weight and wetted to both the CENIGM solder pad and the solder-wettable pad.

Alternatively, the invention may provide a solder connection that includes both a solder joint, including at least 2% In by weight, and a solder bump that may include eutectic Sn—Pb solder. In this embodiment, the solder bump is wetted to the solder-wettable pad and the solder joint is wetted to both the CENIGM solder pad and the solder bump. The invention may further provide that the solder bump contacts the CENIGM solder pad while the solder joint is substantially annular.

Additionally, the invention provides that the first substrate may be an integrated circuit package and the second substrate may be a printed circuit board.

The invention also provides a method for forming a high-strength solder interconnect. The method according to the invention includes obtaining a first substrate including a solder-wettable pad and forming a solder bump on the solder-wettable pad. The method according to the invention additionally includes obtaining a second substrate having a CENIGM solder pad. Next, solder paste, including at least 5% In by weight, is applied to the CENIGM solder pad and the solder bump is moved into contact with the solder paste. The method according to the invention then provides that the solder paste is reflowed to generate a solder joint wetted to the solder bump and the CENIGM solder pad.

The method according to the invention may also provide that the solder bump is then reflowed and allowed to flow together with the solder joint to flow to generate a solder body wetted to the solder-wettable pad that the CENIGM solder pad.

Other features and advantages of the present invention will become apparent from the following detailed description, taken in conjunction with the accompanying drawings, illustrating, by way of example, the principles of the invention.

DESCRIPTION OF THE PREFERRED EMBODIMENT

Figure 1:
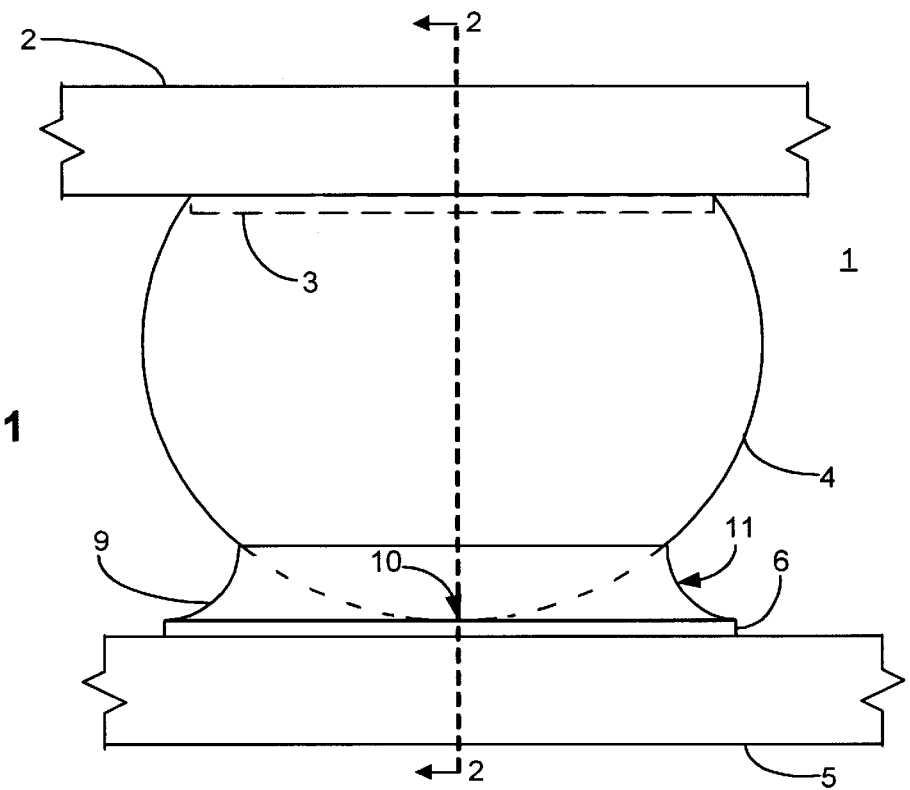
FIG. 1 is a side view of a first preferred embodiment of the high-strength solder interconnect according to the invention.

As shown in the drawings for purposes of illustration, the invention provides a high-strength solder interconnect on a copper/electroless nickel/immersion gold metallization (CENIGM) solder pad and a method for forming high-strength solder interconnects on a CENIGM solder pad. The invention is based upon a structure in which solder including tin (Sn), lead (Pb), and indium (In) is wetted to the CENIGM solder pad.

CENIGM is a multi-layer structure having a base of copper (Cu), under a layer of nickel (Ni), beneath a layer of gold (Au). While the exact thicknesses may vary, typically the Ni layer is 3.81–5.08 microns (150–200 micro-inches) thick and the Au layer is approximately 0.125 microns (5 micro-inches) thick. The process of formation of solder-wettable pads (including CENIGM solder pads) on or within a substrate is known in the art. CENIGM is becoming a more common surface finish for printed circuit boards (PCBs).

The invention will provide a low-cost, high-strength solder interconnect on a CENIGM solder pad that can be formed at a temperature at or below the temperature used in eutectic Sn—Pb solder applications. In addition, the invention provides a method for forming a high-strength solder interconnect on a CENIGM solder pad that doesn't require specialized equipment beyond that already used for forming Sn—Pb solder interconnects. The invention additionally provides a method for forming a high-strength solder interconnect on a CENIGM solder pad that doesn't require significantly more manufacturing time than known Sn—Pb solder interconnect manufacturing techniques.

Figure 2:
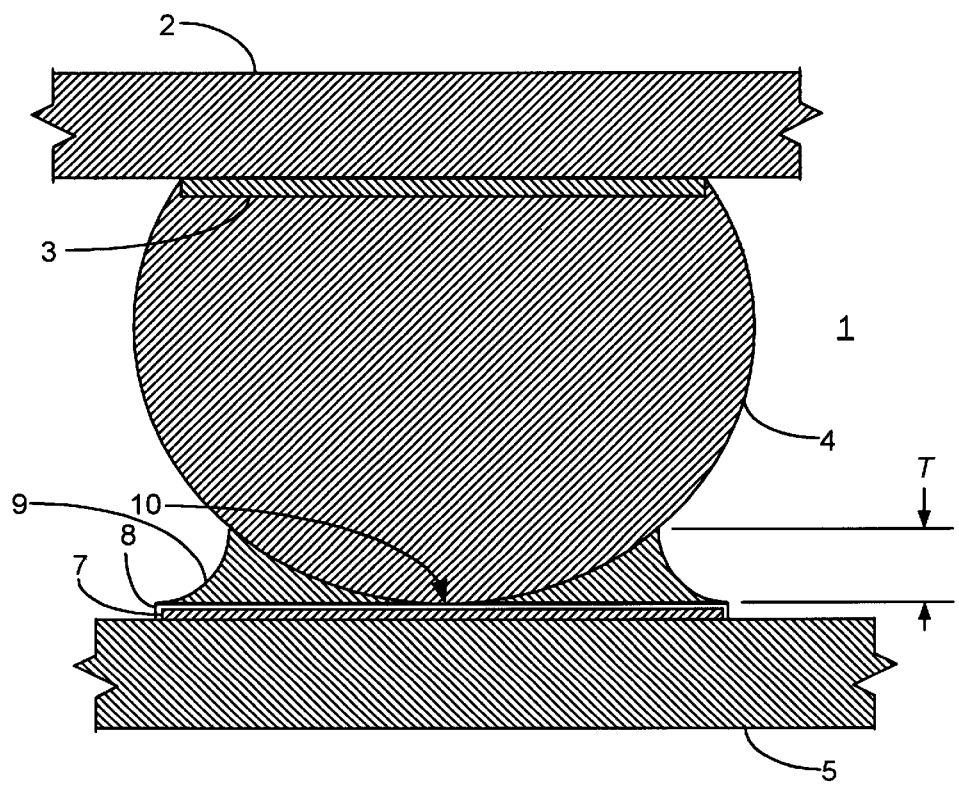
FIG. 2 is a sectional view of the high-strength solder interconnect of FIG. 1 taken along line 2—2.

Referring now to the drawings, it is noted that reference numerals are used to designate identical or similar elements throughout the several views, and that elements are not necessarily shown to scale. Specifically, FIG. 1 and FIG. 2 depict a first preferred embodiment of a high-strength solder interconnect 1 according to the invention in plan and sectional views, respectively.

The high-strength solder interconnect 1 includes a first substrate 2. For purposes of this description, the term substrate may include an integrated circuit die, an integrated circuit package such as a bump grid array (BGA) package, an integrated circuit sub-assembly, a printed-circuit-board (PCB), or any device or structure which may be electrically interconnected to another. The first substrate 2 includes a solder-wettable pad 3. The solder wettable-pad may be formed from any material that is both electrically conductive and to which molten solder tends to adhere. Specifically, a solder-wettable pad may include a copper pad, a plated copper pad, or a CENIGM solder pad.

The high-strength solder interconnect 1, according to the invention, also includes a solder bump 4 wetted to the solder-wettable pad 3. For purposes of this description, the term "wetted" includes not only the process by which molten solder adheres to solder-wettable materials, but also the resulting connection between the solder-wettable material and the solder once the solder has solidified. The formation of solder bumps on solder-wettable pads is known in the art and will be discussed in more detail, below. Typically, solder bumps 4 are formed from eutectic Sn—Pb solder because it is inexpensive and melts at a relatively low temperature of 183° C. It is understood that the solder bump 4 may be formed from eutectic Sn—Pb or may also be formed from a variety of other types solders that are available.

The high-strength solder interconnect 1, according to the invention, additionally includes a second substrate 5 having a CENIGM solder pad 6. In FIG. 2, the Ni layer 7 and the Au layer 8 of the CENIGM solder pad 6 are shown while the Cu layer is not shown.

The high-strength solder interconnect 1, according to the invention, further includes a solder joint 9. The solder joint 9 is wetted to the Au layer 8 of the CENIGM solder pad 6 and the solder bump 4. The solder joint 9 must include at least 2% In, by weight, but may include significantly more In. For example, the solder joint may be completely formed from commercially available 40Sn-40In-20Pb solder. The solder joint 9 should have a melting temperature below the melting temperature of the solder bump 4.

The strength of several examples of solder joints 9 containing various amounts of In are compared to a 63Sn-37Pb solder joint in the following table:

| Solder Alloy | Bending Moment (lbs-in) to break a BGA having 352 solder joints on CENIGM solder pads |
|---|---|
| 63Sn-37Pb | 64 |
| 1In-62Sn-37Pb | 71 |
| 3In-61Sn-36Pb | 85 |
| 5In-60Sn-35Pb | 94 |
| 40In-40Sn-20Pb | 126 |

In the first preferred embodiment of the high-strength solder interconnect 1 according to the invention, it is preferred that the solder bump 4 contact the CENIGM solder pad 6 at contact point 10. Preferably, the contact point 10 is near the center of the CENIGM solder pad 6, and the solder joint 9 encircles the solder bump taking on a substantially annular shape. With such an arrangement, the thickness T of the solder joint 9 is smallest near the contact point 10 and largest at the circumference where outside edge 11 of the solder joint 9 contacts the solder bump 4. It is understood, however, that in some embodiments (not shown) of the high-strength solder interconnect according to the invention, the solder bump 4, may not contact the CENIGM solder pad 6. In such embodiments, the solder bump 4 will be elevated above the CENIGM solder pad 6 and the solder joint 9 will be interposed between the solder bump and the CENIGM solder pad.

Also, in the first preferred embodiment 1 of the high-strength solder interconnect according to the invention, it is preferred that the first substrate 2 is an integrated circuit package such a BGA package and the second substrate 5 is a PCB. It is understood, however, that embodiments of the high-strength solder interconnect may exist where the first substrate and the second substrate are other types of substrates as defined above.

Figure 3:
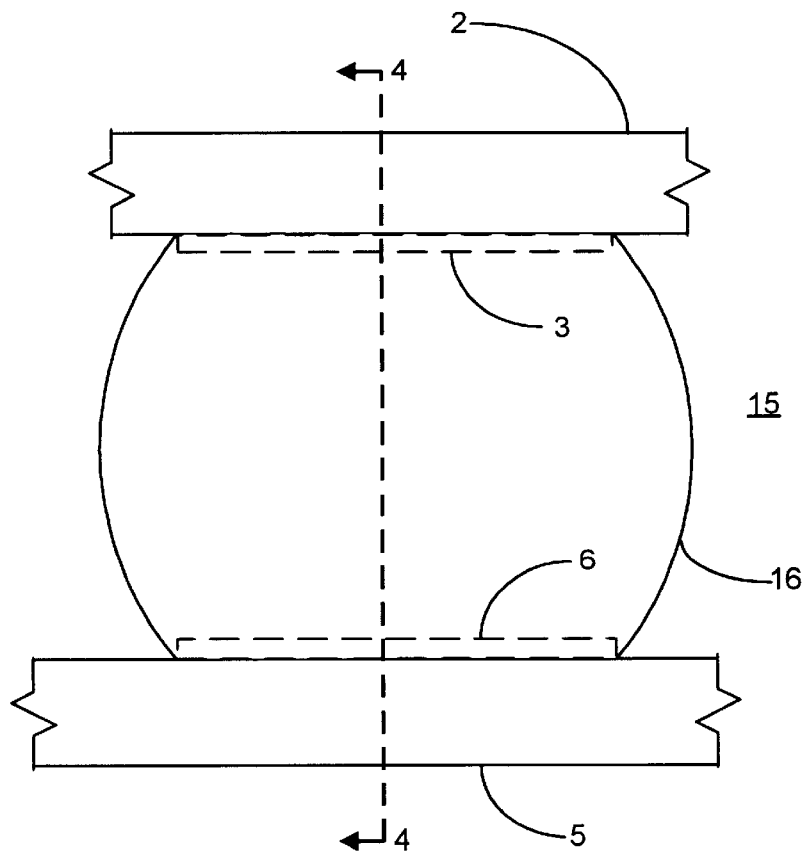
FIG. 3 is a side view of a second preferred embodiment of the high-strength solder interconnect according to the invention.
Figure 4:
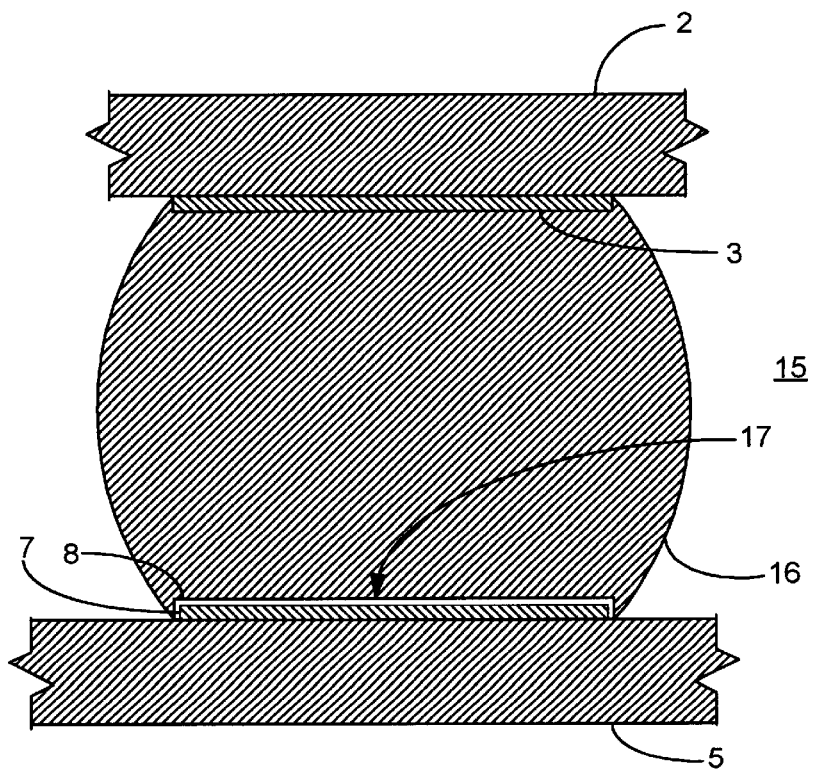
FIG. 4 is a sectional view of the high-strength solder interconnect of FIG. 3 taken along line 4—4.

A second preferred embodiment 15 of the high-strength solder interconnect according to the invention is depicted in FIG. 3 and FIG. 4 in plan and sectional view, respectively. The second preferred embodiment 15, is similar to the first preferred embodiment 1 inasmuch as it includes a first substrate 2 and a second substrate 5. Also like the first preferred embodiment, the first substrate 2 of the second preferred embodiment includes a solder-wettable pad 3 while the second substrate 5 includes a CENIGM solder pad 6. In addition, the CENIGM solder pad 6 includes a Cu layer (not shown), a Ni layer 7 and a Au layer 8.

Unlike the solder bump 4 and solder joint 9 configuration of the first preferred embodiment 1, the second preferred embodiment 15, has only a single solder body 16. The solder body is wetted to both the solder-wettable pad 3 and the Au layer 8 of the CENIGM solder pad 6. The solder body 16 includes Sn, Pb, and In.

In some embodiments of the solder interconnect according to the invention, such as when the solder body 16 is initially formed from a 40Sn-40In-20Pb solder paste, the formulation of the solder alloy forming the solder body will be consistent throughout the solder body. In other embodiments of the solder interconnect, the formulation of the solder alloy forming solder body 16 may vary from location to location within the solder body. In other embodiments the formulation of the solder alloy forming the solder body 16 may change gradually between the end wetting the CENIGM solder pad 6 and the end wetting the solder-wettable pad 3. This gradual change may result, for example, when the solder body 16 is formed by heating a structure similar to that of the first embodiment in FIG. 1 beyond the point where the both the solder joint 9 and solder bump 4 melt and flow together. It is important to note that in all embodiments the percentage of In, by weight, should be at least 2% at the junction surface 17 where the solder body 16 wets the Au layer 8. Keeping the percentage of In at junction surface 17 above 2% ensures a high-strength connection between the solder body and the CENIGM solder pad 6.

Also, in the second preferred embodiment 15 of the high-strength solder interconnect according to the invention, it is preferred that the first substrate 2 is an integrated circuit package such a BGA package and the second substrate 5 is a PCB. It is understood, however, that embodiments of the high-strength solder interconnect may exist where the first substrate and the second substrate are other types of substrates as defined above.

Figure 5:
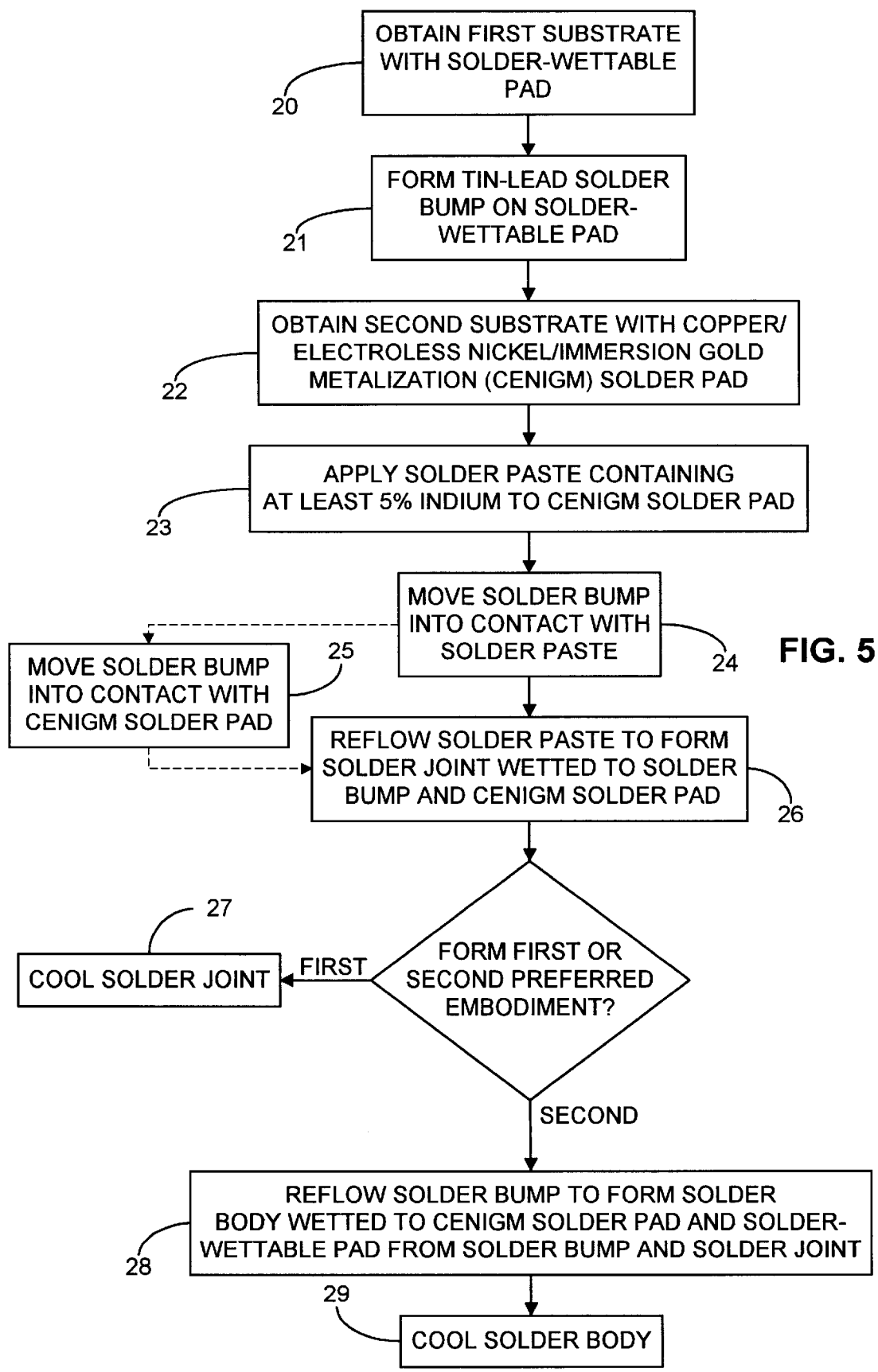
FIG. 5 is a block diagram of a method of forming high-strength solder interconnects according to the invention.

FIG. 5 is a block diagram depicting a method of forming high-strength solder interconnects according to the invention. The method according to the invention begins by obtaining a first substrate 2 including a solder-wettable pad 3 (block 20). As discussed above, the first substrate may be an integrated circuit die, an integrated circuit package such as a bump grid array (BGA) package, an integrated circuit sub-assembly, a printed-circuit-board (PCB), or any device or structure which may be electrically interconnected to another. The solder wettable-pad may be formed from any material that is both electrically conductive and to which molten solder tends to adhere. Specifically, a solder-wettable pad may include, but is not limited to, a copper pad, a plated copper pad, or a CENIGM solder pad. The process of forming solder-wettable pads on substrates is known in the art.

Next, a Sn—Pb solder bump 4 is formed on the solder-wettable pad 3 (block 21). The solder bump may be formed using a method termed contained paste deposition (CPD) described in U.S. Pat. No. 5,539,153 assigned to the assignee of this invention. CPD provides for effective "micro-stenciling" of substances. Using a CPD process, a mask (not shown) is used to micro stencil solder paste (not shown) onto the solder-wettable pad 3. For purposes of this description, solder paste may include any substance containing solder that can be made to conform to the shape of a cavity at room temperature. Typically, solder paste includes a conglomeration of small solder spheres held together with a binding agent that includes a solder flux. The solder paste is then reflowed and forms into a solder sphere wetted to the solder pad 3. The solder sphere is cooled, forming the solder bump 4. The mask may then be removed. While many types of solder paste can be used to form the solder bump, it is preferred that the solder paste be of a type designed to form eutectic Sn—Pb solder when reflowed.

A second substrate 5 having a CENIGM solder pad 6 is then obtained (block 22). Once again the second substrate may be an integrated circuit die, an integrated circuit package such as a bump grid array (BGA) package, an integrated circuit sub-assembly, a printed-circuit-board (PCB), or any device or structure which may be electrically interconnected to another. The process of forming CENIGM solder pads on substrates is known in the art.

Next, a small amount of solder paste (as compared to the amount of solder paste used to form the solder bump 4) containing at least 5% In by weight and having a melting temperature below that of the solder bump 4 is applied to the surface of the CENIGM solder pad 6 (block 23). A solder paste containing at least 5% In is used to ensure the solder joint that will form from the solder paste (see block 26, below) includes at least 2% In, by weight. It is understood that some of the In within the solder paste may be absorbed during reflow (see block 26 and block 28, below) into the solder bump 4 and the Au layer 8 of the CENIGM solder pad 6. At least 2% In must remain in the solder at the interface of the solder joint and the CENIGM solder pad after reflow. In addition, the 5% In content helps lower the melting temperature of the solder paste below that of the eutectic Sn—Pb solder in the solder bump. Processes for applying small amounts of solder paste to specific solder pads are known in the semiconductor industry and are used in surface mount processes.

The solder bump 4, is then moved into contact with the solder paste (block 24). It is preferred, but not required, that the solder bump next be moved further through the solder paste until the solder bump is directly in contact with the CENIGM solder pad 6 (block 25). This provides good electrical contact with the CENIGM solder pad and ensures that the solder paste (not shown) is contacting a sufficiently large area of the solder bump 4.

Next, the solder paste is reflowed, and the molten solder forms a solder joint 9 wetted to both the solder bump and the CENIGM solder pad 6 (block 26).

At this point, all that remains to finish a high-strength solder interconnect according to the first preferred embodiment 1 of the invention as shown in FIG. 1 is to cool the solder joint 9 until it solidifies (block 27). On the other hand, a high-strength solder interconnect according to the second preferred embodiment 15 of the invention as shown in FIG. 3 may be created by further heating the solder joint until the solder bump 4 reflows (block 28). This allows the molten solder bump 4 and the molten solder joint 9 to flow together and form a solder body 16 wetted to both the solder-wettable pad 3 and the CENIGM solder pad 6.

The solder body 16 may then be cooled until it solidifies (block 29).

Having thus described exemplary embodiments of the invention, it will be apparent that further alterations, modifications, and improvements will also occur to those skilled in the art. Such alterations, modifications, and improvements, though not expressly described or mentioned above, are nonetheless intended and implied to be within the scope of the invention. Accordingly, the foregoing discussion is intended to be illustrative only; the invention is limited and defined only by the various following claims and equivalents thereto.

We claim:

1. A high-strength solder interconnect comprising:
   a first substrate, including a solder-wettable pad;
   a solder bump wetted to the solder-wettable pad;
   a second substrate, including a copper/electroless nickel/immersion gold metallization (CENIGM) solder pad; and
   a solder joint wetted to the CENIGM solder pad and the solder bump, the solder joint including at least two percent (2%) indium by weight.

2. The high-strength solder interconnect of claim 1, in which the solder bump contacts the CENIGM solder pad.

3. The high-strength solder interconnect of claim 1, in which the solder joint is substantially annular.

4. The high-strength solder interconnect of claim 1, in which the solder bump includes tin-lead solder.

5. The high-strength solder interconnect of claim 4, in which the solder bump includes eutectic tin-lead solder.

6. The high-strength solder interconnect of claim 1, in which the first substrate is an integrated circuit package.

7. The high-strength solder interconnect of claim 6, in which the second substrate is a printed circuit board.

8. A high-strength solder interconnect comprising:
   a first substrate, including a solder-wettable pad;
   a second substrate, including a copper/electroless nickel/immersion gold metallization (CENIGM) solder pad; and
   a solder body wetted to the CENIGM solder pad and the solder-wettable pad, the solder body including tin, lead, and at least two percent (2%) indium by weight at a solder body-CENIGM junction surface.

9. The high-strength solder interconnect of claim 8, in which the solder body includes 40Sn-40In-20Pb solder.

10. The high-strength solder interconnect of claim 8, in which the first substrate is an integrated circuit package.

11. The high-strength solder interconnect of claim 10, in which the second substrate is a printed circuit board.

12. A method for forming a high-strength solder interconnect, the method comprising:
   (a) obtaining a first substrate including a solder-wettable pad;
   (b) forming a solder bump on the solder-wettable pad;
   (c) obtaining a second substrate including a copper/electroless nickel/immersion gold metallization (CENIGM) solder pad;
   (d) applying a solder paste to the CENIGM solder pad, the solder paste including tin, lead, and at least five percent (5%) indium by weight;
   (e) moving the solder bump into contact with the solder paste; and
   (f) reflowing the solder paste to generate a solder joint wetted to the solder bump and the CENIGM solder pad.

13. The method of claim 12, in which the solder bump formed in step (b) substantially includes eutectic tin-lead solder.

14. The method of claim 12, additionally comprising:
(g) reflowing the solder bump and allowing the solder bump and the solder joint to flow together to generate a solder body wetted to the solder-wettable pad and the CENIGM solder pad.

15. The method of claim 12, in which step (e) additionally comprises:
moving the solder bump into contact with the CENIGM solder pad.

16. The method of claim 15, in which the solder joint generated in step (f) is substantially annular.

17. The method of claim 12, in which step (f) additionally comprises:
heating the solder paste to a temperature that is above a point where the solder paste becomes molten and below a point where the solder bump begins to melt.

18. The method of claim 17, in which step (f) additionally comprises:
forcing the first substrate and the second substrate together while the solder paste is molten.

19. The method of claim 12, in which the first substrate obtained in step (a) is an integrated circuit package.

20. The method of claim 19, in which the second substrate obtained in step (c) is a printed circuit board.

* * * * *